(12) United States Patent
Freitag et al.

(10) Patent No.: US 7,230,802 B2
(45) Date of Patent: Jun. 12, 2007

(54) METHOD AND APPARATUS FOR PROVIDING MAGNETOSTRICTION CONTROL IN A FREELAYER OF A MAGNETIC MEMORY DEVICE

(75) Inventors: James Mac Freitag, San Jose, CA (US); Mustafa Michael Pinarbasi, Morgan Hill, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 193 days.

(21) Appl. No.: 10/712,168

(22) Filed: Nov. 12, 2003

(65) Prior Publication Data

US 2005/0099740 A1    May 12, 2005

(51) Int. Cl.
G11B 5/127    (2006.01)
(52) U.S. Cl. .................................. 360/324.12
(58) Field of Classification Search .............. None
See application file for complete search history.

(56) References Cited

U.S. PATENT DOCUMENTS

| | | | | |
|---|---|---|---|---|
| 6,500,570 B2* | 12/2002 | Hasegawa et al. | ....... | 428/811.2 |
| 6,538,858 B1* | 3/2003 | Hasegawa et al. | ..... | 360/324.12 |
| 6,665,155 B2* | 12/2003 | Gill | ....... | 360/324.12 |
| 6,728,083 B2* | 4/2004 | Pinarbasi | ............... | 360/324.11 |
| 6,801,411 B1* | 10/2004 | Lederman et al. | ..... | 360/324.11 |
| 6,888,705 B2* | 5/2005 | Fontana et al. | ........ | 360/324.12 |
| 7,068,536 B2* | 6/2006 | Matsutera et al. | .......... | 365/171 |
| 2002/0039264 A1* | 4/2002 | Ohsawa et al. | ............. | 360/322 |
| 2002/0069511 A1* | 6/2002 | Hasegawa et al. | ....... | 29/603.14 |
| 2002/0075722 A1* | 6/2002 | Ooshima | .................... | 365/158 |
| 2004/0012898 A1* | 1/2004 | Hasegawa | ............. | 360/324.11 |
| 2004/0017639 A1* | 1/2004 | Deak | .......................... | 360/290 |
| 2004/0023075 A1* | 2/2004 | Saito et al. | ......... | 428/694 MM |
| 2004/0109265 A1* | 6/2004 | Gill | ........................ | 360/324.12 |
| 2004/0218311 A1* | 11/2004 | Saito et al. | ................. | 360/314 |
| 2005/0002131 A1* | 1/2005 | Gill | ........................ | 360/324.12 |
| 2005/0017314 A1* | 1/2005 | Gill | ............................. | 257/421 |
| 2005/0024797 A1* | 2/2005 | Pinarbasi | ............... | 360/324.12 |
| 2005/0030675 A1* | 2/2005 | Gill | ........................ | 360/324.11 |
| 2005/0052792 A1* | 3/2005 | Gill | ........................ | 360/324.12 |
| 2005/0068685 A1* | 3/2005 | Gill | .......................... | 360/324.1 |
| 2005/0073777 A1* | 4/2005 | Hasegawa et al. | .......... | 360/321 |
| 2005/0073878 A1* | 4/2005 | Lin et al. | ..................... | 365/158 |
| 2005/0141145 A1* | 6/2005 | Gill | .......................... | 360/324.1 |
| 2006/0023375 A1* | 2/2006 | Gill | ........................ | 360/324.11 |
| 2006/0044706 A1* | 3/2006 | Gill | ........................ | 360/324.12 |
| 2006/0126228 A1* | 6/2006 | Yoshikawa et al. | ......... | 360/315 |
| 2006/0152864 A1* | 7/2006 | Ohtsu et al. | ........... | 360/324.12 |
| 2006/0187591 A1* | 8/2006 | Gill et al. | .............. | 360/324.12 |

\* cited by examiner

*Primary Examiner*—Allen Cao
(74) *Attorney, Agent, or Firm*—David W. Lynch; Chambliss Bahner & Stophel P.C.

(57) ABSTRACT

A method and apparatus for providing magnetostriction control in a free layer of a magnetic memory device is disclosed. The same target compositions for the free layers may be used, but the relative thickness values are modified to obtain a desired magnetostriction without a change in the magenetoristance ratio, $\Delta R/R$.

11 Claims, 11 Drawing Sheets

METHOD AND APPARATUS FOR PROVIDING MAGNETOSTRICTION CONTROL IN A FREELAYER OF A MAGNETIC MEMORY DEVICE

BACKGROUND OF THE INVENTION

1. Field of the Invention

This invention relates in general to sensors for magnetic storage devices, and more particularly to a method and apparatus for providing magnetostriction control in a free layer of a magnetic memory device.

2. Description of Related Art

Magnetic recording is a key segment of the information-processing industry. While the basic principles are one hundred years old for early tape devices, and over forty years old for magnetic hard disk drives, an influx of technical innovations continues to extend the storage capacity and performance of magnetic recording products. For hard disk drives, the areal density or density of written data bits on the magnetic medium has increased by a factor of more than two million since the first disk drive was used for data storage. Areal density continues to grow due to improvements in magnet recording heads, media, drive electronics, and mechanics.

Magnetic recording heads have been considered the most significant factor in areal-density growth. The ability of the magnetic recording heads to both write and subsequently read magnetically recorded data from the medium at data densities well into the gigabits per square inch (Gbits/in$^2$) range gives hard disk drives the power to remain the dominant storage device for many years to come.

Important components of computing platforms are mass storage devices including magnetic disk and magnetic tape drives, where magnetic tape drives are popular, for example, in data backup applications. Write and read heads are employed for writing magnetic data to and reading magnetic data from the recording medium. The read and write heads are connected to processing circuitry that operates according to a computer program to implement the writing and reading functions.

A magnetoresistive (MR) sensor changes resistance in the presence of a magnetic field. Recorded data can be read from a recorded magnetic medium, such as a magnetic disk, because the magnetic field from the recorded magnetic medium causes a change in the direction of magnetization in the read element, which causes a corresponding change in the sensor resistance.

A magnetoresistive (MR) sensor detects magnetic field signals through the resistance changes of a sensing element as a function of the strength and direction of magnetic flux being sensed by the sensing element. Conventional MR sensors, such as those used as MR read heads for reading data in magnetic recording disk and tape drives, operate on the basis of the anisotropic magnetoresistive (AMR) effect of the bulk magnetic material, which is typically permalloy. A component of the read element resistance varies as the square of the cosine of the angle between the magnetization direction in the read element and the direction of sense current through the read element. Recorded data can be read from a magnetic medium, such as the magnetic disk in a magnetic disk drive, because the external magnetic field from the recorded magnetic medium (the signal field) causes a change in the direction of magnetization in the read element, which in turn causes a change in resistance of the read element. This change in resistance may be used to detect magnetic transitions recorded on the recording media.

In the past several years, prospects of increased storage capacity have been made possible by the discovery and development of sensors based on the giant magnetoresistance (GMR) effect, also known as the spin-valve effect. In a spin valve sensor, the GMR effect varies as the cosine of the angle between the magnetization of the pinned layer and the magnetization of the free layer. Recorded data can be read from a magnetic medium because the external magnetic field from the recorded magnetic medium, or signal field, causes a change in the direction of magnetization of the free layer, which in turn causes a change in the resistance of the spin valve sensor and a corresponding change in the sensed current or voltage.

Magnetic sensors utilizing the GMR effect are found in mass storage devices such as, for example, magnetic disk and tape drives and are frequently referred to as spin-valve sensors. In an AFM pinned spin valve, the pinned layer is magnetically pinned or oriented by an adjacent pinning layer. In a self-pinned spin valve, the magnetic moment of the pinned layer is pinned in the fabrication process, i.e., the magnetic moment is set by the specific thickness and composition of the film.

Recently, magnetic tunnel junction sensor devices have been proposed for a variety of applications, including read heads for magnetic disks as well as magnetoresistive random access memory. A magnetic tunnel junction (MTJ) is a type or magnetoresistive device made of at least two magnetic film layers separated by an insulating barrier. The insulating barrier is thin enough to allow electrons to quantum mechanically tunnel through the barrier. Resistance of an MTJ is directly related to the tunneling probability that depends on the relative orientation of the magnetization vectors of the magnetic layers. Because the orientation of the magnetization vector depends on the applied field, the resistance of a MTJ device varies in the presence of a magnetic field.

Spin valve sensors and MTJ devices include at least three layers of thin material that combine into a single structure. A free layer acts as the sensing layer. The free layer is passed over the surface of the data bits to be read. It is free to rotate in response to the magnetic patterns on the disk. A separation layer is provide adjacent the free layer. In a GMR sensor, the separation layer is a conductor, such as copper. In MTJ devices, the separation layer is an insulation layer, such as $Al_2O_3$. The pinned layer is a layer of material that is held in a fixed magnetic orientation as described above.

Free layer magnetostriction is one of the key parameters that need to be controlled for good sensor performance. A free layer is often formed using a bilayer structure, such as CoFe and NiFe. Currently the magnetostriction control for bilayer structure for the free layer is accomplished by changing the composition of a layer, e.g., the NiFe or CoFe layer. However, changing the composition of a layer is very time consuming and costly, but is often required as sensor designs change.

It can be seen that there is a need for a method and apparatus for providing magnetostriction control in a free layer of a magnetic memory device.

SUMMARY OF THE INVENTION

To overcome the limitations in the prior art described above, and to overcome other limitations that will become apparent upon reading and understanding the present specification, the present invention discloses a method and apparatus for providing magnetostriction control in a free layer of a magnetic memory device.

The present invention solves the above-described problems by providing the same target compositions for the free layers, but modifying the relative thickness values to obtain a desired magnetostriction without a substantial change in the magnetoresistance ratio, ΔR/R.

A method in accordance with the principles of the present invention includes forming a pinned layer, forming a separation layer over the pinned layer, forming a first free layer having a first thickness and forming a second free layer having a second thickness, the ratio of the first thickness and second thickness being selected to provide a desired magnetostriction.

In another embodiment of the present invention, a magnetic sensor is provided. The magnetic sensor includes a pinned layer, a separation layer formed over the pinned layer, a first free layer having a first thickness formed over the separation layer and a second free layer having a second thickness formed over the first free layer, wherein the ratio of the first thickness and second thickness is selected to provide a desired magnetostriction.

In another embodiment of the present invention, a magnetic tunnel junction sensor is provided. The magnetic tunnel junction sensor includes a magnetic tunnel junction device including a pinned layer, an insulation layer formed over the pinned layer, a first free layer having a first thickness formed over the insulation layer and a second free layer having a second thickness formed over the first free layer, wherein the ratio of the first thickness and second thickness is selected to provide a desired magnetostriction, a current source coupled to the magnetic tunnel junction device and a magnetoresistance detector, coupled to the magnetic tunnel junction device, for detecting an electrical resistance through the magnetic tunnel junction device based on magnetic orientations of the first and the second free layers.

In another embodiment of the present invention, a magnetic storage system is provided. The magnetic storage system includes a movable magnetic recording medium, a magnetic sensor for detecting magnetic signals on the moveable recording medium, including a pinned layer, a separation layer formed over the pinned layer, a first free layer having a first thickness formed over the separation layer and a second free layer having a second thickness formed over the first free layer, wherein the ratio of the first thickness and second thickness is selected to provide a desired magnetostriction, a magnetoresistance detector, coupled to the magnetic sensor, for detecting an electrical resistance through the magnetic sensor based on magnetic orientations of the first and the second free layers and an actuator, coupled to the magnetic sensor, for moving the sensor relative to the medium.

In another embodiment of the present invention, a spin valve sensor is provided. The spin valve sensor includes a bilayer free layer structure, the bilayer free layer structure including a first free layer having a first thickness and a second free layer having a second thickness formed over the first free layer, wherein the ratio of the first thickness and second thickness is selected to provide a desired magnetostriction, a ferromagnetic pinned layer structure having a magnetic moment, a nonmagnetic conductive separation layer disposed between the free layer structure and the pinned layer structure, an anti-ferromagnetic pinning layer coupled to the pinned layer structure for pinning the magnetic moment of the pinned layer structure, hard magnetic thin films in an abutting relationship with the free layer structure on both sides of the free layer structure and a seedlayer structure adjacent the pinning layer structure.

In another embodiment of the present invention, a spin valve sensor is provided. The spin valve sensor includes a bilayer free layer structure, the bilayer free layer structure including a first free layer having a first thickness and a second free layer having a second thickness formed over the first free layer, wherein the ratio of the first thickness and second thickness is selected to provide a desired magnetostriction, a self-pinned layer structure having a magnetic moment, a nonmagnetic conductive separation layer disposed between the free layer structure and the self-pinned layer structure, hard magnetic thin films in an abutting relationship with the free layer structure on both sides of the free layer structure and a seedlayer structure adjacent the pinning layer structure.

In another embodiment of the present invention, a magnetic sensor is provided. The magnetic sensor includes means for providing a fixed magnetic orientation, bilayer means, disposed over the means for providing a fixed magnetic orientation, for sensing a magnetic field, the bilayer means including first and second means for providing a magnetization that is free to rotate, the first means having a first thickness for sensing a magnetic field and second means having a second thickness for sensing a magnetic field, means for separating the means for providing a pinning field from the bilayer means, wherein the ratio of the first thickness and second thickness is selected to provide a desired magnetostriction.

These and various other advantages and features of novelty which characterize the invention are pointed out with particularity in the claims annexed hereto and form a part hereof. However, for a better understanding of the invention, its advantages, and the objects obtained by its use, reference should be made to the drawings which form a further part hereof, and to accompanying descriptive matter, in which there are illustrated and described specific examples of an apparatus in accordance with the invention.

BRIEF DESCRIPTION OF THE DRAWINGS

Referring now to the drawings in which like reference numbers represent corresponding parts throughout.

DETAILED DESCRIPTION OF THE INVENTION

In the following description of the embodiments, reference is made to the accompanying drawings that form a part hereof, and in which is shown by way of illustration the specific embodiments in which the invention may be practiced. It is to be understood that other embodiments may be utilized because structural changes may be made without departing from the scope of the present invention.

The present invention provides a method and apparatus for providing magnetostriction control in a free layer of a magnetic memory device. The same target compositions for the free layers may be used, but the relative thickness values are modified to obtain a desired magnetostriction without a change in the magnetoresistance ratio, $\Delta R/R$.

Figure 1:
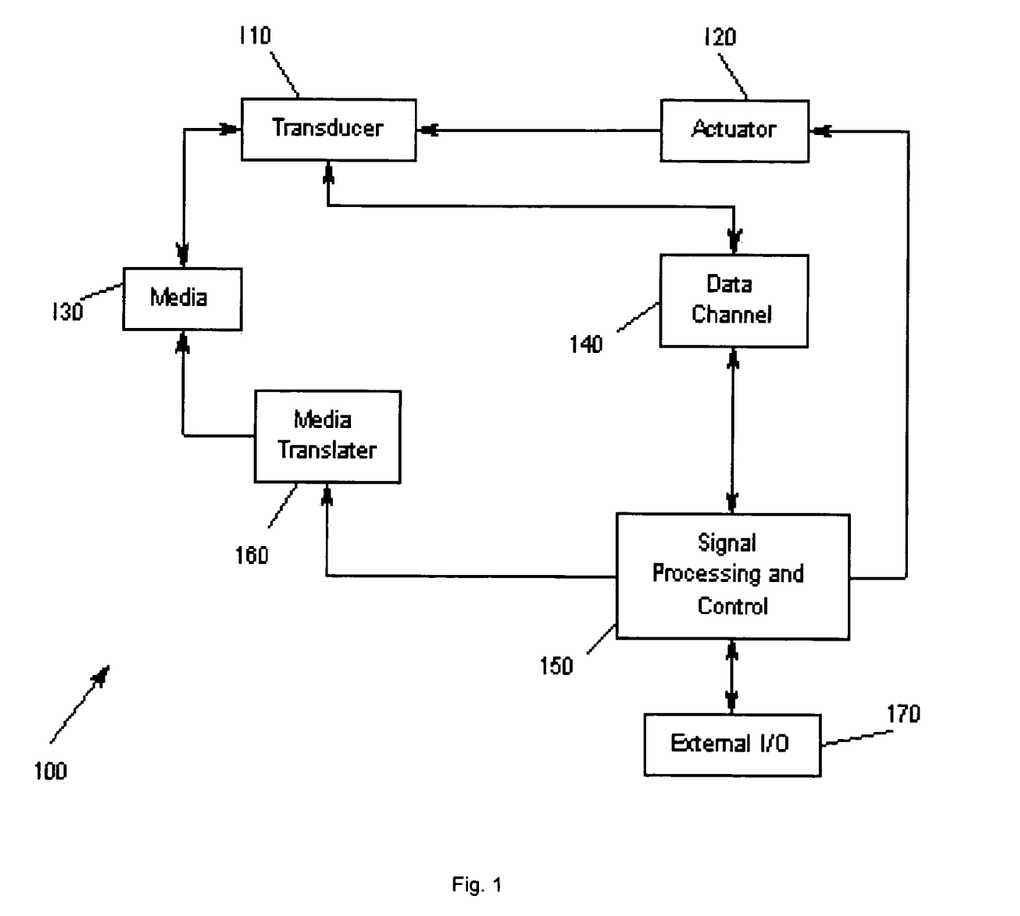
FIG. 1 illustrates a storage system according to an embodiment of the present invention.

FIG. 1 illustrates an exemplary storage system 100 according to the present invention. A transducer 110 is under control of an actuator 120, whereby the actuator 120 controls the position of the transducer 110. The transducer 110 writes and reads data on magnetic media 130. The read/write signals are passed to a data channel 140. A signal processor 150 controls the actuator 120 and processes the signals of the data channel 140 for data exchange with external Input/Output (I/O) 170. I/O 170 may provide, for example, data and control conduits for a desktop computing application, which utilizes storage system 100. In addition, a media translator 160 is controlled by the signal processor 150 to cause the magnetic media 130 to move relative to the transducer 110. The present invention is not meant to be limited to a particular type of storage system 100 or to the type of media 130 used in the storage system 100.

Figure 2:
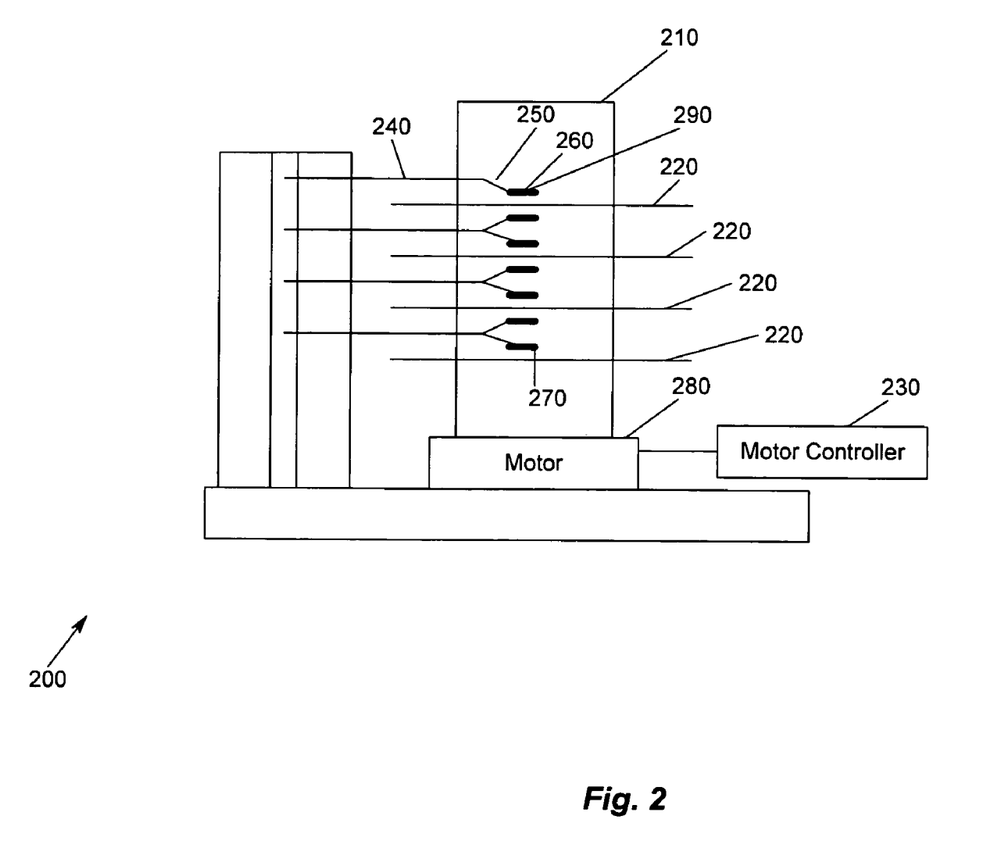
FIG. 2 illustrates one storage system according to an embodiment of the present invention.

FIG. 2 illustrates one particular embodiment of a multiple magnetic disk storage system 200 according to the present invention. In FIG. 2, a hard disk drive storage system 200 is shown. The system 200 includes a spindle 210 that supports and rotates multiple magnetic disks 220. The spindle 210 is rotated by motor 280 that is controlled by motor controller 230. A combined read and write magnetic head 270 is mounted on slider 260 that is supported by suspension 250 and actuator arm 240. Processing circuitry exchanges signals that represent information with read/write magnetic head 270, provides motor drive signals for rotating the magnetic disks 220, and provides control signals for moving the slider 260 to various tracks. Although a multiple magnetic disk storage system is illustrated, a single magnetic disk storage system is equally viable in accordance with the present invention.

The suspension 250 and actuator arm 240 position the slider 260 so that read/write magnetic head 270 is in a transducing relationship with a surface of magnetic disk 220. When the magnetic disk 220 is rotated by motor 280, the slider 240 is supported on a thin cushion of air (air bearing) between the surface of disk 220 and the ABS 290. Read/write magnetic head 270 may then be employed for writing information to multiple circular tracks on the surface of magnetic disk 220, as well as for reading information therefrom.

Figure 3:
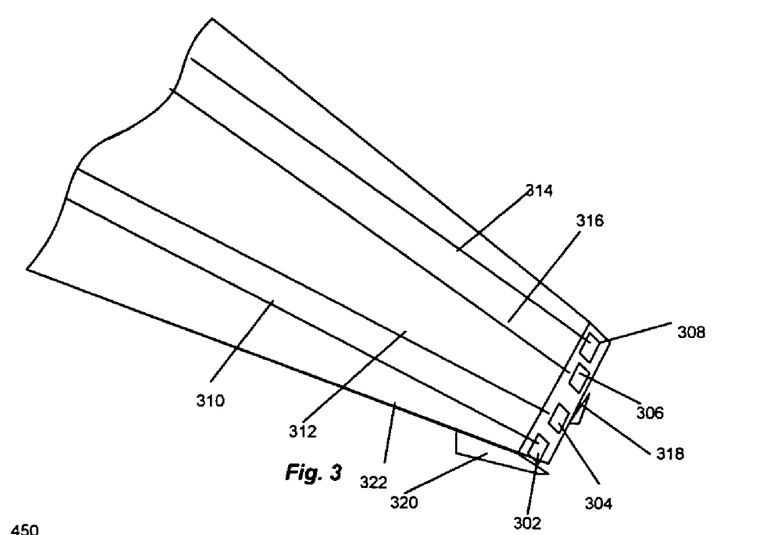
FIG. 3 illustrates a slider mounted on a suspension according to an embodiment of the present invention.

FIG. 3 illustrates a slider 320 mounted on a suspension 322. First and second solder connections 302 and 308 connect leads from the sensor 318 to leads 310 and 314, respectively, on suspension 322 and third and fourth solder connections 304 and 306 connect to the write coil (not shown) to leads 312 and 316, respectively, on suspension 322.

Figure 4:
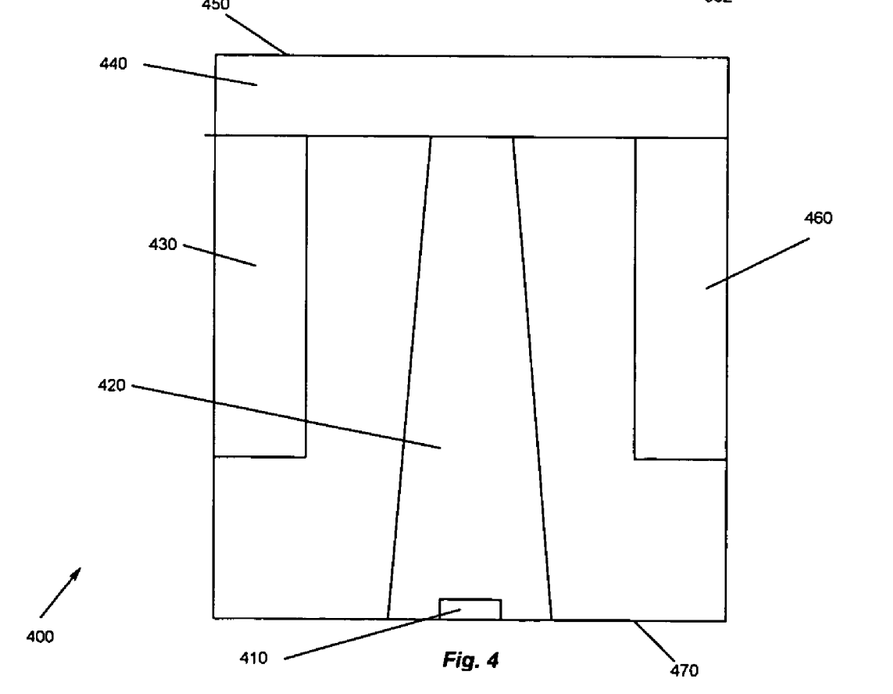
FIG. 4 illustrates an ABS view of the slider and the magnetic head according to an embodiment of the present invention.

FIG. 4 is an ABS view of slider 400 and magnetic head 410. The slider has a center rail 420 that supports the magnetic head 410, and side rails 430 and 460. The support rails 420, 430 and 460 extend from a cross rail 440. With respect to rotation of a magnetic disk, the cross rail 440 is at a leading edge 450 of slider 400 and the magnetic head 410 is at a trailing edge 470 of slider 400.

The above description of a typical magnetic recording disk drive system, shown in the accompanying FIGS. 1–4, is for presentation purposes only. Storage systems may contain a large number of recording media and actuators, and each actuator may support a number of sliders. In addition, instead of an air-bearing slider, the head carrier may be one that maintains the head in contact or near contact with the disk, such as in liquid bearing and other contact and near-contact recording disk drives.

Figure 5:
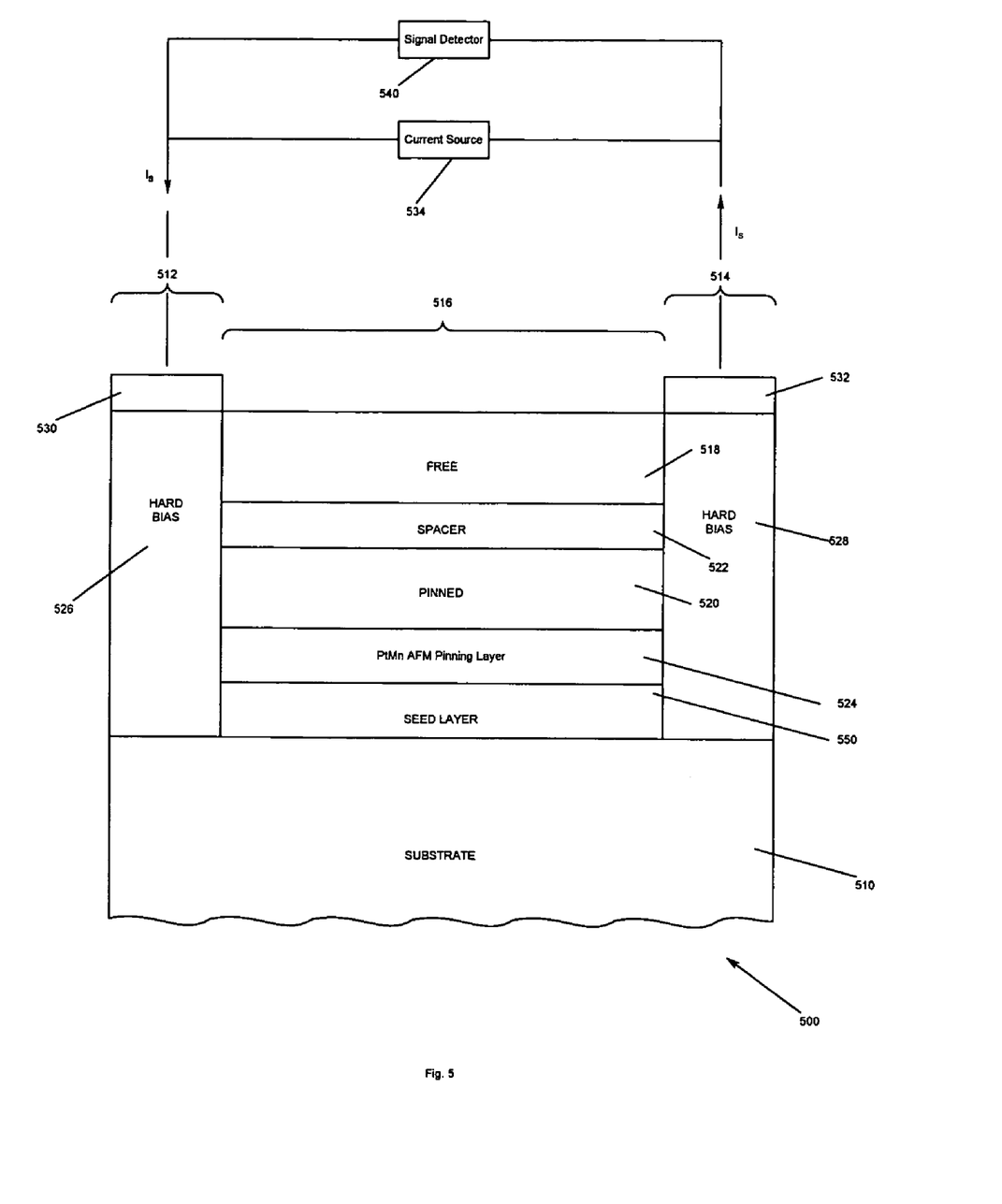
FIG. 5 illustrates an air bearing surface view of a GMR sensor according to an embodiment of the present invention.

FIG. 5 illustrates an air bearing surface view of a GMR sensor 500 according to an embodiment of the present invention. GMR heads are very attractive for use as high density recording magneto resistive (MR) heads because of their high readback output voltages, linear response, and symmetrical read sensitivity profiles.

In FIG. 5, an air bearing surface view of a GMR sensor 500 including end regions 512 and 514 separated by a central region 516 is shown. A free layer (free ferromagnetic layer) 518 is separated from a pinned layer (AP-pinned ferromagnetic layer) 520 by a non-magnetic, electrically conducting separation layer 522 (typically, primarily copper). The free layer 518 according to an embodiment of the present invention will be discussed in more detail below. The magnetization of the pinned layer 520 may be fixed through exchange coupling with an antiferromagnetic (AFM) layer 524. The magnetization of the free layer 518, however, is free to rotate in the presence of an external field. Free layer 518, separation layer 522, pinned layer 520 and the AFM layer 524 are all formed in the central region 516.

Hard bias layers 526 and 528 formed in the end regions 512 and 514, respectively, provide longitudinal bias for the free layer 518. A seedlayer structure 550 is provided on a substrate 510 to promote the texture and enhance the grain growth of each of the layers consequently grown adjacent to the seedlayer structure 550, such as the hard bias layer. Leads 530 and 532 formed over hard bias layers 526 and 528, respectively, provide electrical connections for the flow of the sensing current $I_s$, from a current source 534 to the GMR sensor 500. A signal detector 540, which is electrically connected to the leads 530 and 532, senses the change in resistance of the GMR sensor 500 due to changes induced by the external magnetic field (e.g., the field generated when a field transition on a disk is moved past the GMR sensor 500). A cap (not shown) is optionally provided on the free layer 518. Other constructions of the GMR sensor 500 are possible, and one skilled in the art could readily adapt the present invention for use with such alternative constructions.

Within the sandwich structure of the GMR head sensor, i.e., "sensing free layer", "conducting space layer", and "pinned layer", the magnetization of the free layer is free to respond to external magnetic field from the media. The magnetization of the pinned layer is pinned at about 90° to the magnetization of the free layer. As the conduction electrons are scattered between the free and pinned layers through the separation layer, the electrical resistance of the head changes in response to the angle of the directions of magnetization between the free and pinned layers.

Figure 6:
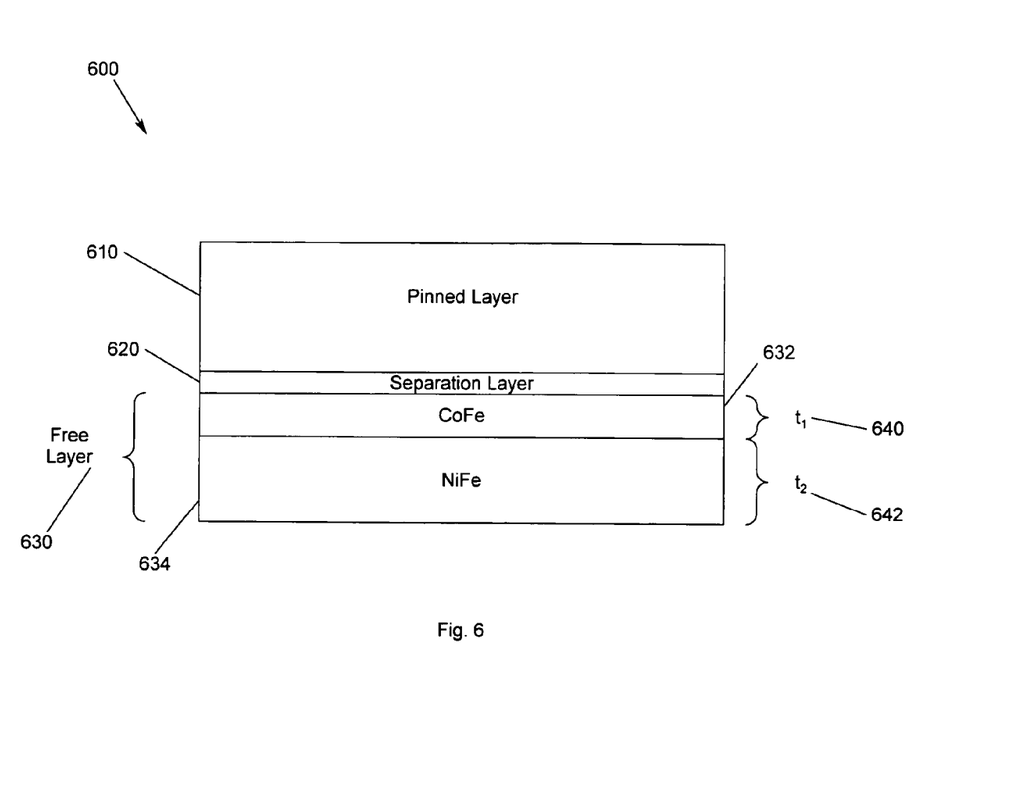
FIG. 6 illustrates a layered structure according to an embodiment of the present invention.

FIG. 6 illustrates a layered structure 600 according to an embodiment of the present invention. In FIG. 6, a pinned layer 610, separation layer 620 and free layer 630 are shown. The free layer 630 is a bilayer structure that may include, for example a CoFe layer 632 and a NiFe layer 634. The composite magnetostriction of the free layer 630 needs to be tightly controlled for magnetic memory applications. This control has previously been accomplished by changing the composition of one of the layers 632, 634, i.e., the NiFe target. However, according to an embodiment of the present invention, better control can be achieved by changing the thickness ratio between the layers 632, 634 in the free layer 630. FIG. 6 illustrates a free layer 630 wherein the relative thickness of the free layers 632, 634 are selected to have a ratio that provides a desired magnetostriction. Thus, the magnetostriction of the free layer 630 is controlled, not by changing the target compositions of the first and second layers 632, 634, but rather by modifying the relative thickness values of the free layers 632, 634 to obtain a desired magnetostriction. In FIG. 6, the first free layer 632 is designed to have a thickness of $t_1$ 640 and the second free layer 634 is designed to have a thickness $t_2$ 642. The ratio $t_1/t_2$ determines the magnetostriction. Those skilled in the art will recognize that the present invention is not meant to be limited to particular materials for the free layers 632, 634. Nevertheless, the preferred embodiment of the present invention includes a CoFe layer 632 selected to have a thickness of $t_1$ and a NiFe free layer 634 designed to have a thickness $t_2$.

Changing the relative thickness ratio of the free layers 632, 634 to control magnetostriction is easier and cheaper than changing the composition of, for example, the CoFe/NiFe free layer 630. Moreover, changing the relative thickness ratio between layers 632. 634 of the free layer 630 to control magnetostriction makes it possible to select any magnetostriction value within a range to meet the requirements for the free layer 630. In contrast, changing the composition of the free layers 632, 634 to control magnetostriction requires the use of many target compositions to obtain the same type of magnetostriction values.

Figure 7:
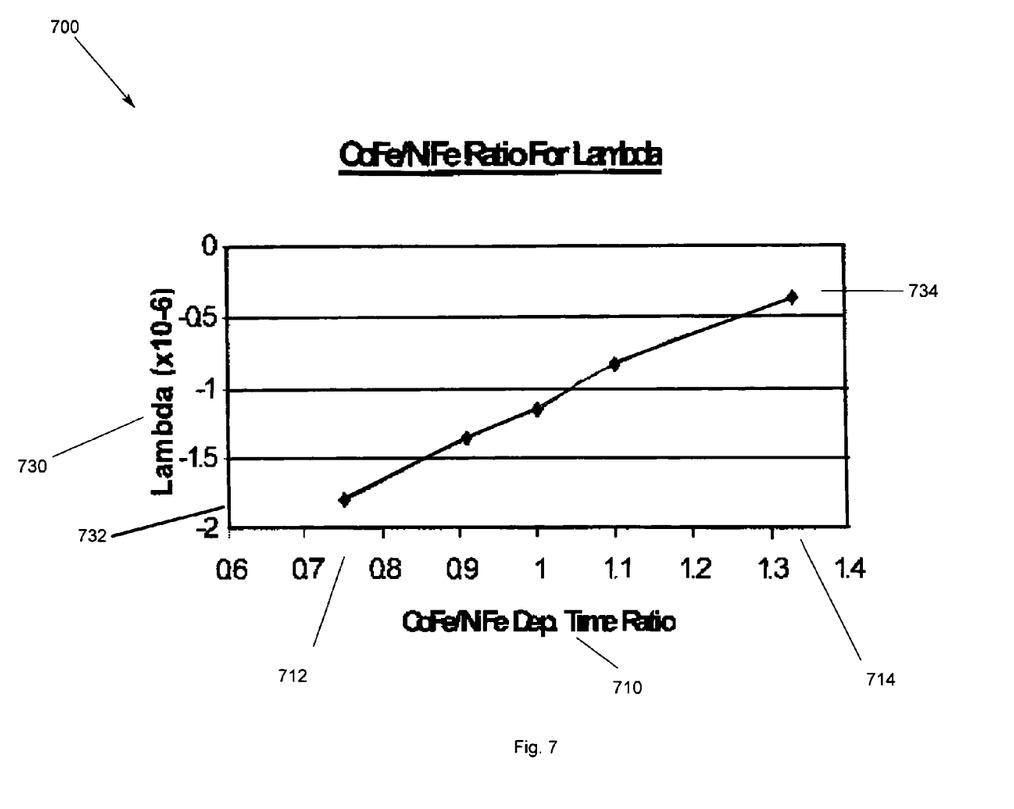
FIG. 7 illustrates a plot of the CoFe/NiFe ratio according to an embodiment of the present invention.

FIG. 7 illustrates a plot 700 of a ratio between CoFe/NiFe free layers according to an embodiment of the present invention. FIG. 7 shows that better control can be achieved by changing CoFe/NiFe ratio in the free layer. In FIG. 7, the CoFe/NiFe deposition time ratio 710 varies from about 0.75 712 to 1.35 714. The composite magnetostriction 730 varies from $-1.8 \times 10^{-6}$ 732 to $-0.4 \times 10^{-6}$ 734.

Figure 8:
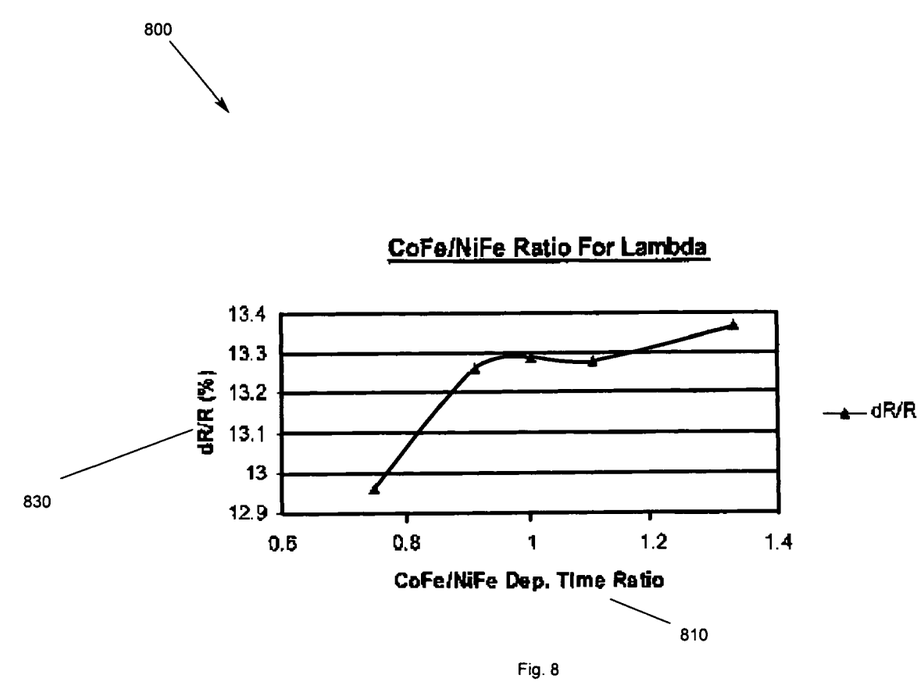
FIG. 8 is a plot of the dR/R for a range of CoFe/NiFe ratios for a sensor according to an embodiment of the present invention.

FIG. 8 is a plot 800 of the dR/R for a range of CoFe/NiFe ratios for a sensor according to an embodiment of the present invention. In FIG. 8, the magnetoresistance ratio (MR ratio) 830, dR/R, is the percentage change in resistance as an external magnetic field is switched between high and low values. FIG. 8 illustrates that the MR ratio 830 is nearly constant with increasing CoFe/NiFe ratios 810, i.e., 12.95% to 13.37%.

Figure 9:
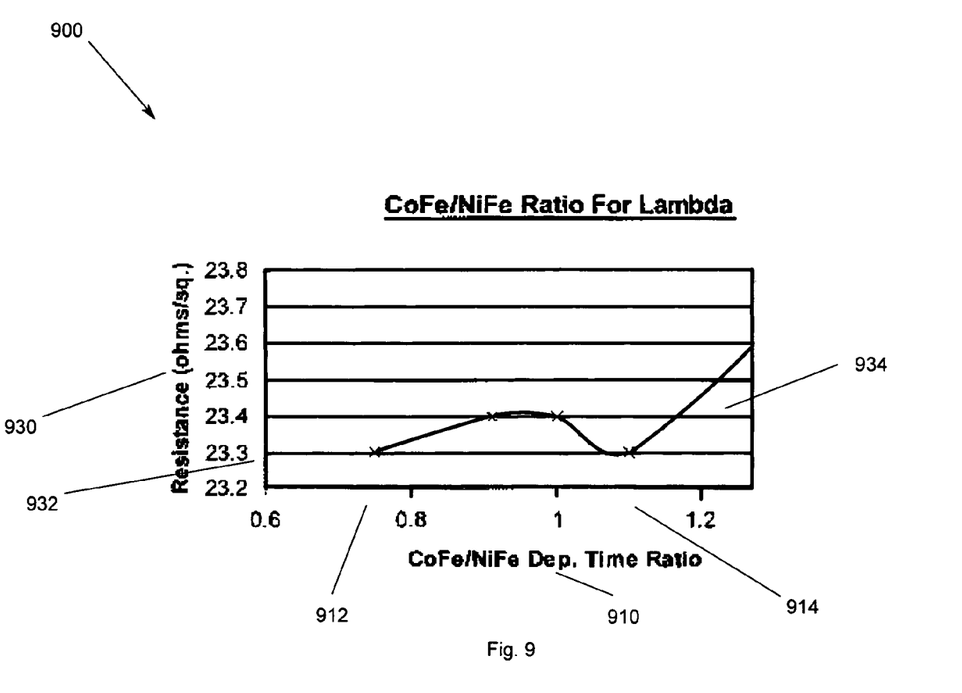
FIG. 9 is a plot of the sensor resistance for a range of CoFe/NiFe ratios according to an embodiment of the present invention.

FIG. 9 is a plot 900 of the sensor resistance for a range of CoFe/NiFe ratios according to an embodiment of the present invention. In FIG. 9, the sensor resistance 930 does not significantly change with increasing CoFe/NiFe ratios 910. The sensor resistance 930 varies from 23.3 ohms/sq. 932 to 23.4 ohms/sq. 834 for a CoFe/NiFe ratio 910 range of about 0.75 912 to 1.05 914.

Figure 10:
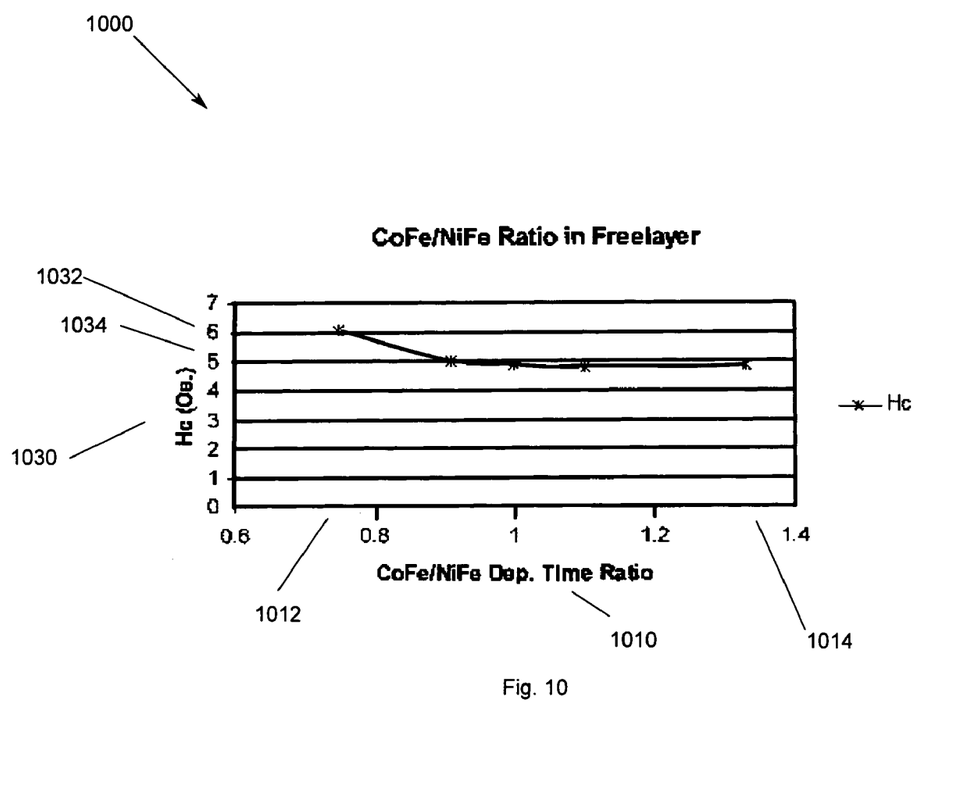
FIG. 10 is a plot of the coercivity of the free layer for a range of CoFe/NiFe ratios according to an embodiment of the present invention.

FIG. 10 is a plot 1000 of the coercivity of the free layer for a range of CoFe/NiFe ratios according to an embodiment of the present invention. In FIG. 10, the coercivity 1030 does not increase significantly with increasing CoFe/NiFe ratios 1010. The coercivity 1030 varies from about 6 Oe 1032 to about 4.8 Oe 1034 for a CoFe/NiFe ratio 1010 range of about 0.75 1012 to 1.35 1014.

Figure 11:
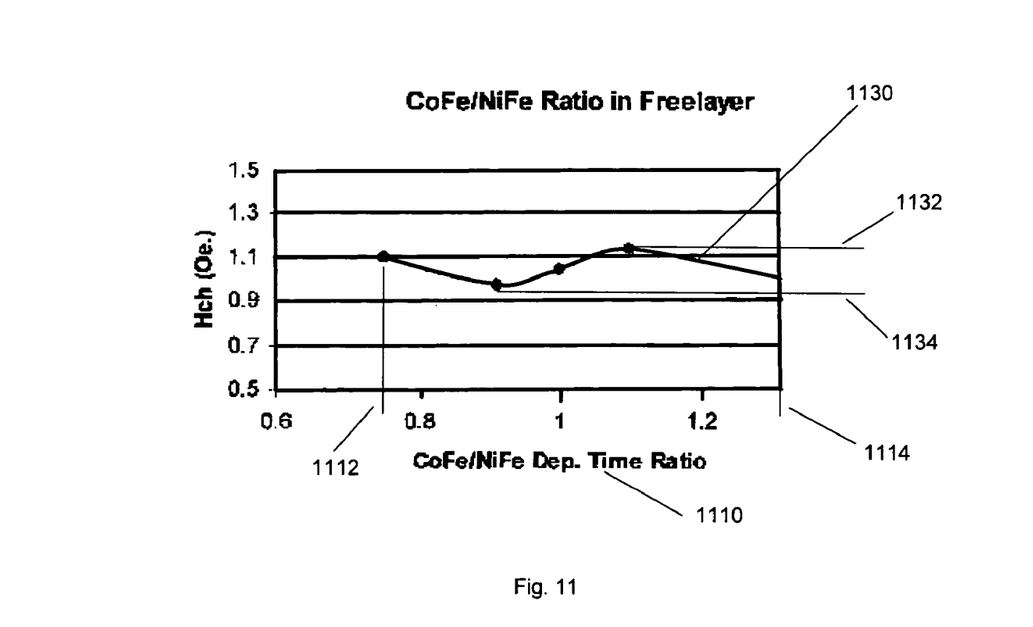
FIG. 11 is a plot of the hard axis coercivity of the free layer for a range of CoFe/NiFe ratios according to an embodiment of the present invention.

FIG. 11 is a plot 1100 of the hard axis coercivity of the free layer for a range of CoFe/NiFe ratios according to an embodiment of the present invention. In FIG. 11, the hard axis coercivity 1130 is relatively constant with increasing CoFe/NiFe ratios 1110. The hard axis coercivity varies from about 1.1 Oe 1132 to about 0.95 Oe 1134 for a CoFe/NiFe ratio 1110 range of about 0.75 1112 to 1.35 1114.

Figure 12:
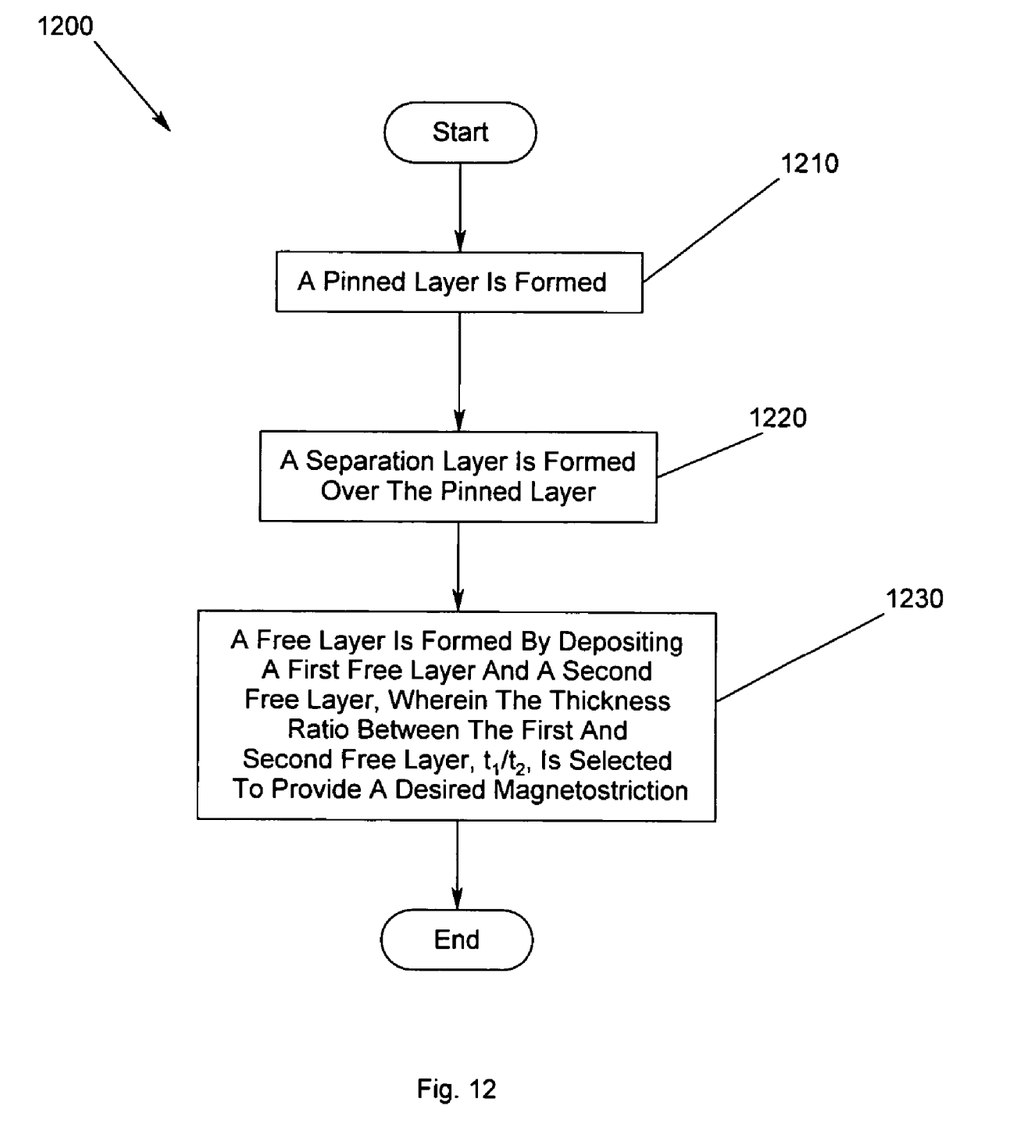
FIG. 12 is a flow chart for forming a magnetic memory device with a desired magnetostriction in a free layer of the magnetic memory device.

FIG. 12 is a flow chart 1200 for forming a magnetic memory device with a desired magnetostriction in a free layer of the magnetic memory device. In FIG. 12, a pinned layer is formed 1210. A separation layer is formed over the pinned layer 1220. A free layer is formed by depositing a first free layer and a second free layer, e.g., CoFe and NiFe, wherein the thickness ratio between the first and second free layer, $t_1/t_2$, is selected to provide a desired magnetostriction 1230.

Accordingly, the present invention provides a method and apparatus for providing magnetostriction control in a free layer of a magnetic memory device. The same target compositions for the CoFe and NiFe layers are used, but the relative thickness values are modified to obtain a desired magnetostriction. Further, FIGS. 8–12 demonstrates that a change in the CoFe/NiFe ratio does not deteriorate the properties of structure according to an embodiment of the present invention.

The foregoing description of the exemplary embodiment of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather by the claims appended hereto.

What is claimed is:

1. A method for controlling magnetostriction in a free layer of a magnetic memory device, comprising:
   forming a pinned layer;
   forming a separation layer over the pinned layer;
   forming a bilayer, composite free layer, the forming the bilayer, composite free layer includes:
      forming a first free layer of CoFe; and
      forming a second free layer of NiFe;
      wherein the forming the first free layer of CoFe and the forming of the second free layer of NiFe further comprises forming a thickness ratio of the first free layer of CoFe to second layer of NiFe by forming the first free layer of CoFe with a predetermined first thickness and forming the second free layer of NiFe with a predetermined second thickness, wherein the ratio of the predetermined first thickness to the predetermined second thickness is selected to provide a predetermined magnetostriction without changing the composition of the first or second free layer.

2. The method of claim 1, wherein the separation layer is a conductor layer.

3. The method of claim 1, wherein the separation layer is an insulation layer.

4. A magnetic sensor, comprising:
   a pinned layer;
   a separation layer formed over the pinned layer;
   a bilayer, composite free layer, the bilayer, composite free layer includes:

a first free layer of CoFe formed over the separation layer; and a second free layer of NiFe formed over the first free layer;

wherein the first free layer of CoFe includes a first predetermined thickness and the second free layer of NiFe includes a second predetermined thickness, the first and second predetermined thicknesses are selected to provide a predetermined thickness ratio of the first free layer of CoFe to second layer of NiFe to provide a predetermined magnetostriction without changing the composition of the first or second free layer.

5. The magnetic sensor of claim 4, wherein the separation layer is a conductor layer.

6. The magnetic sensor of claim 4, wherein the separation layer is an insulation layer.

7. A magnetic tunnel junction sensor, comprising:
a magnetic tunnel junction device comprising:
  a pinned layer;
  an insulation layer formed over the pinned layer;
  a bilayer, composite free layer, the bilayer, composite free layer includes:
    a first free layer of CoFe formed over the separation layer; and
    a second free layer of NiFe formed over the first free layer,
    wherein the first free layer of CoFe includes a first predetermined thickness and the second free layer of NiFe includes a second predetermined thickness, the first and second predetermined thicknesses are selected to provide a predetermined thickness ratio of the first free layer of CoFe to second layer of NiFe to provide a predetermined magnetostriction without changing the composition of the first or second free layer;
a current source coupled to the magnetic tunnel junction device; and
a magnetoresistance detector, coupled to the magnetic tunnel junction device, for detecting an electrical resistance though the magnetic tunnel junction device based on magnetic orientations of the first and the second free layers.

8. A magnetic storage system, comprising:
a movable magnetic recording medium;
a magnetic sensor for detecting magnetic signals on the moveable recording medium, comprising:
  a pinned layer;
  a separation layer formed over the pinned layer;
  a bilayer, composite free layer, the bilayer, composite free layer includes:
    a first free layer of CoFe formed over the separation layer; and
    a second free layer of NiFe formed over the first free layer;
    wherein the first free layer of CoFe includes a first predetermined thickness and the second free layer of NiFe includes a second predetermined thickness, the first and second predetermined thicknesses are selected to provide a predetermined thickness ratio of the first free layer of CoFe to second layer of NiFe to provide a predetermined magnetostriction without changing the composition of the first or second free layer;
a magnetoresistance detector, coupled to the magnetic sensor, for detecting an electrical resistance though the magnetic sensor based on magnetic orientations of the first and the second free layers; and
an actuator, coupled to the magnetic sensor, for moving the sensor relative to the medium.

9. A spin valve sensor, comprising
a bilayer free layer structure, the bilayer free layer structure including a first free layer of CoFe having a first predetermined thickness formed and a second free layer of NiFe having a second predetermined thickness formed over the first free layer, wherein a thickness ratio of the first free layer of CoFe to second layer of NiFe is selected to provide a predetermined magnetostriction without changing the composition of the first or second free layer;
a ferromagnetic pinned layer structure having a magnetic moment;
a nonmagnetic conductive separation layer disposed between the free layer structure and the pinned layer structure;
an anti-ferromagnetic pinning layer coupled to the pinned layer structure for pinning the magnetic moment of the pinned layer structure;
hard magnetic thin films in an abutting relationship with the free layer structure on both sides of the free layer structure; and
a seed layer structure adjacent the pinning layer structure.

10. A spin valve sensor, comprising
a bilayer free layer structure, the bilayer free layer structure including a first free layer having of CoFe a first predetermined thickness and a second free layer of NiFe having a second predetermined thickness formed over the first free layer, wherein a thickness ratio of the first free layer of CoFe to second layer of NiFe is selected to provide a predetermined magnetostriction without changing the composition of the first or second free layer;
a self pinned layer structure having a magnetic moment;
a nonmagnetic conductive separation layer disposed between the free layer structure and the self pinned layer structure;
hard magnetic thin films in an abutting relationship with the free layer structure on both sides of the free layer structure; and
a seed layer structure adjacent a pinning layer structure.

11. A magnetic sensor, comprising:
means for providing a fixed magnetic orientation;
bilayer means, disposed over the means for providing a fixed magnetic orientation, for sensing a magnetic field, the bilayer means including first and second means for providing a magnetization that is free to rotate, the first means having a first predetermined thickness of CoFe for sensing a magnetic field and second means having a second predetermined thickness of NiFe for sensing a magnetic field;
means for separating the means for providing a pinning field from the bilayer means;
wherein a thickness ratio of the first free layer of CoFe to second layer of NiFe is selected to provide a predetermined magnetostriction without changing the composition of the first or second free layer.

* * * * *

UNITED STATES PATENT AND TRADEMARK OFFICE
CERTIFICATE OF CORRECTION

PATENT NO. : 7,230,802 B2
APPLICATION NO. : 10/712168
DATED : June 12, 2007
INVENTOR(S) : Freitag et al.

It is certified that error appears in the above-identified patent and that said Letters Patent is hereby corrected as shown below:

Col. 10, Line 2: "though" should read --through--
Col. 10, Line 41: "self pinned" should read --self-pinned--

Signed and Sealed this

Twenty-eighth Day of August, 2007

JON W. DUDAS
*Director of the United States Patent and Trademark Office*